(12) United States Patent
Motomura et al.

(10) Patent No.: US 11,798,776 B2
(45) Date of Patent: Oct. 24, 2023

(54) CHARGED PARTICLE BEAM APPARATUS

(71) Applicant: Hitachi High-Tech Corporation, Tokyo (JP)

(72) Inventors: Shunichi Motomura, Tokyo (JP); Tsunenori Nomaguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 185 days.

(21) Appl. No.: 17/595,282

(22) PCT Filed: May 15, 2019

(86) PCT No.: PCT/JP2019/019234
§ 371 (c)(1),
(2) Date: Nov. 12, 2021

(87) PCT Pub. No.: WO2020/230285
PCT Pub. Date: Nov. 19, 2020

(65) Prior Publication Data
US 2022/0238296 A1    Jul. 28, 2022

(51) Int. Cl.
*H01J 37/09*    (2006.01)
*H01J 37/153*   (2006.01)
*H01J 37/244*   (2006.01)

(52) U.S. Cl.
CPC ............ *H01J 37/09* (2013.01); *H01J 37/153* (2013.01); *H01J 37/244* (2013.01); *H01J 2237/0453* (2013.01)

(58) Field of Classification Search
CPC ........ H01J 37/09; H01J 37/153; H01J 37/244; H01J 2237/0453; H01J 2237/1534
See application file for complete search history.

(56) References Cited

U.S. PATENT DOCUMENTS 3,100,260 A * 8/1963 Wilska .................. H01J 37/153
                                                           850/9
4,982,099 A * 1/1991 Lischke .................. H01J 37/09
                                                           313/422
(Continued)

FOREIGN PATENT DOCUMENTS

JP       57-60371 U       4/1982
JP    2006-318774 A      11/2006
(Continued)

OTHER PUBLICATIONS

International Search Report (PCT/ISA/210) issued in PCT Application No. PCT/JP2019/019234 dated Jun. 11, 2019 with English translation (four (4) pages).
(Continued)

*Primary Examiner* — David A Vanore
(74) *Attorney, Agent, or Firm* — Crowell & Moring LLP

(57) ABSTRACT

Provided is a charged particle beam apparatus capable of stably obtaining a spherical aberration correction effect. The charged particle beam apparatus includes: a charged particle beam aperture stop 121 and an electrode 122 that are arranged on an optical axis between the charged particle beam source 101 and the objective lens 105; and a power supply 108 that applies a voltage between the charged particle beam aperture stop 121 and the electrode 122, in which the voltage that is applied from the electrode to the charged particle beam aperture stop by the power supply is a voltage having a polarity opposite to a charge of the charged particle beam, the electrode 122 includes an annular aperture 205, and the charged particle beam aperture stop 121 includes a plurality of apertures 201 that are arranged at positions overlapping the annular aperture 205 of the electrode 122 when viewed in a direction Z along the optical axis.

15 Claims, 7 Drawing Sheets

(56) References Cited

U.S. PATENT DOCUMENTS

| | | | | |
|---|---|---|---|---|
| 5,182,492 A | * | 1/1993 | Chen | H01J 29/488 313/414 |
| 2006/0255269 A1 | * | 11/2006 | Kawasaki | H01J 37/153 250/310 |
| 2008/0116391 A1 | * | 5/2008 | Ito | H01J 37/28 250/396 ML |
| 2009/0173887 A1 | * | 7/2009 | Ito | H01J 37/153 250/396 ML |
| 2010/0072387 A1 | * | 3/2010 | Sawada | H01J 37/26 250/396 ML |
| 2011/0139980 A1 | * | 6/2011 | Nakano | H01J 37/153 250/307 |
| 2011/0192976 A1 | * | 8/2011 | Own | H01J 37/153 250/311 |
| 2015/0248944 A1 | * | 9/2015 | Cheng | H01J 37/153 250/398 |
| 2016/0056011 A1 | * | 2/2016 | Khursheed | H01J 37/153 250/396 ML |
| 2018/0114670 A1 | * | 4/2018 | Kawasaki | H01J 37/153 |
| 2018/0254167 A1 | * | 9/2018 | Zhao | H01J 37/222 |
| 2020/0211815 A1 | | 7/2020 | Nomaguchi et al. | |
| 2021/0027977 A1 | | 1/2021 | Motomura et al. | |
| 2021/0333211 A1 | * | 10/2021 | Chen | C12Q 1/6806 |
| 2022/0238296 A1 | * | 7/2022 | Motomura | H01J 37/09 |
| 2022/0246388 A1 | * | 8/2022 | Rauwolf | H01J 37/21 |
| 2023/0101108 A1 | * | 3/2023 | Mohammadi-Gheidari | H01J 37/145 250/396 R |

FOREIGN PATENT DOCUMENTS

| | | |
|---|---|---|
| JP | 2016-46263 A | 4/2016 |
| WO | WO 2016/174891 A1 | 11/2016 |
| WO | WO 2018/220809 A1 | 12/2018 |
| WO | WO 2019/186936 A1 | 10/2019 |

OTHER PUBLICATIONS

Japanese-language Written Opinion (PCT/ISA/237) issued in PCT Application No. PCT/JP2019/019234 dated Jun. 11, 2019 (three (3) pages).

* cited by examiner

[FIG. 1]
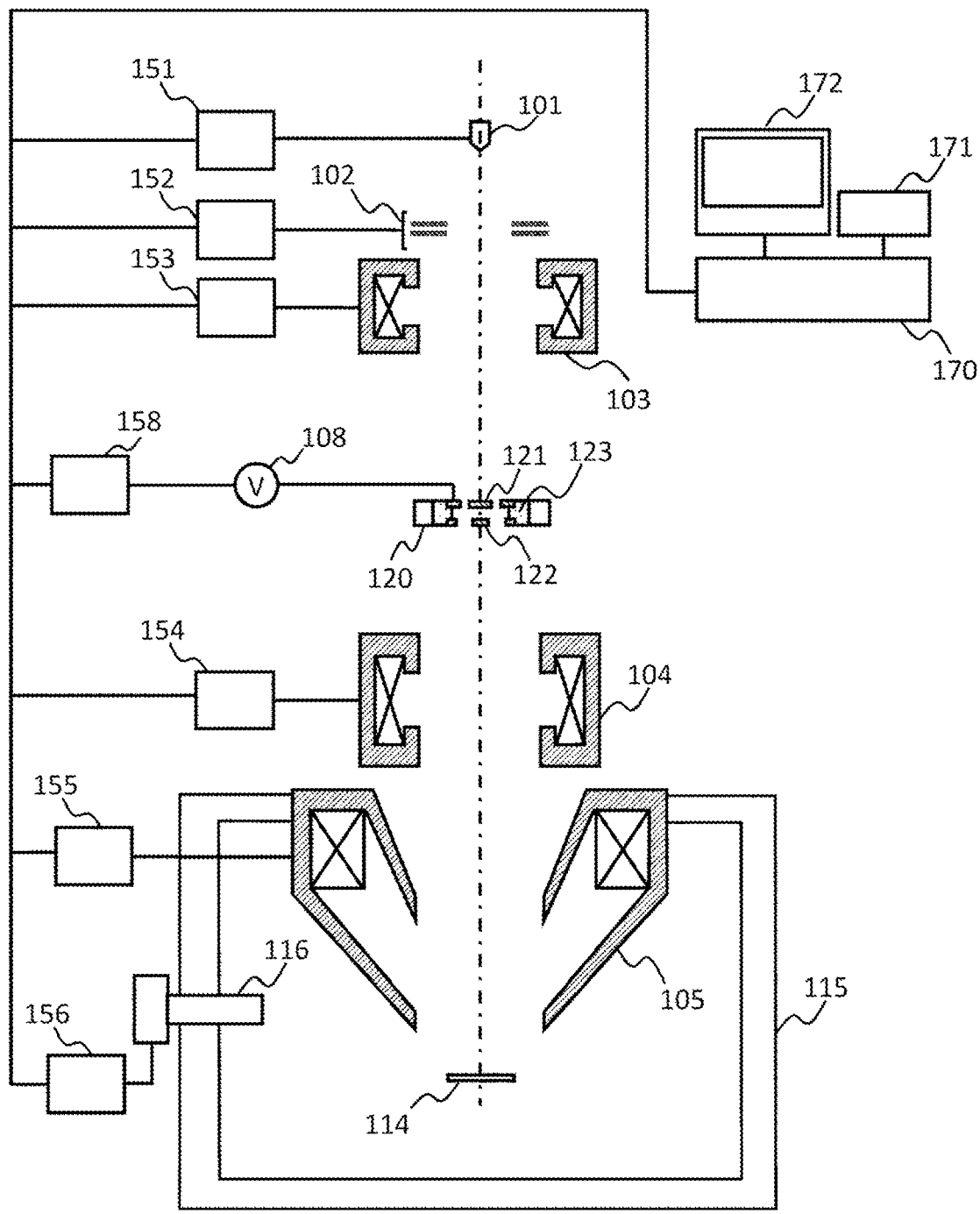

[FIG. 2A]
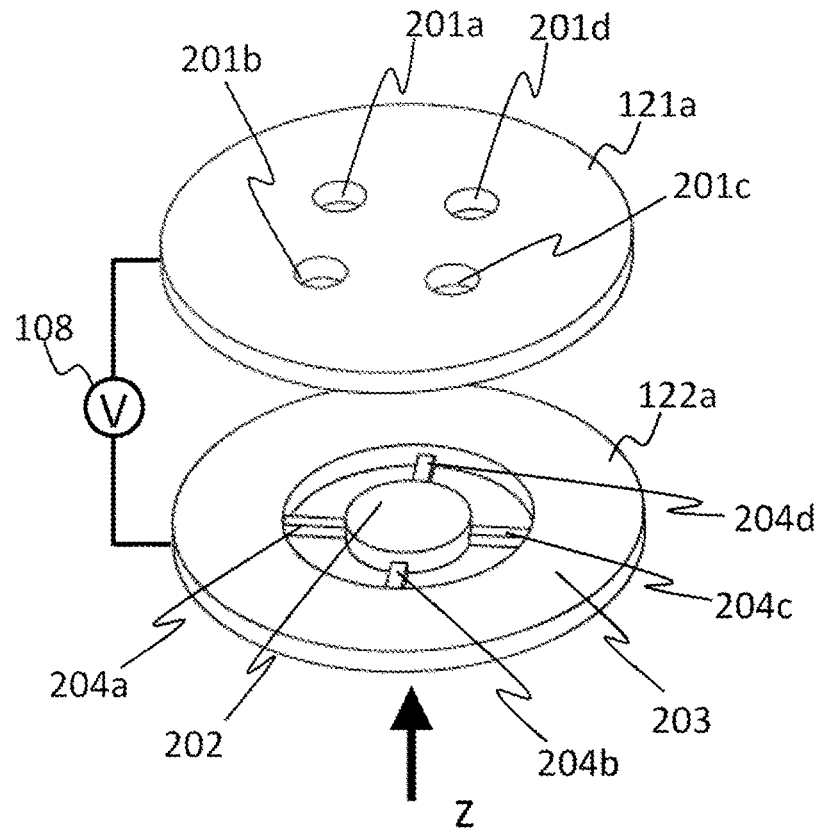
[FIG. 2B]
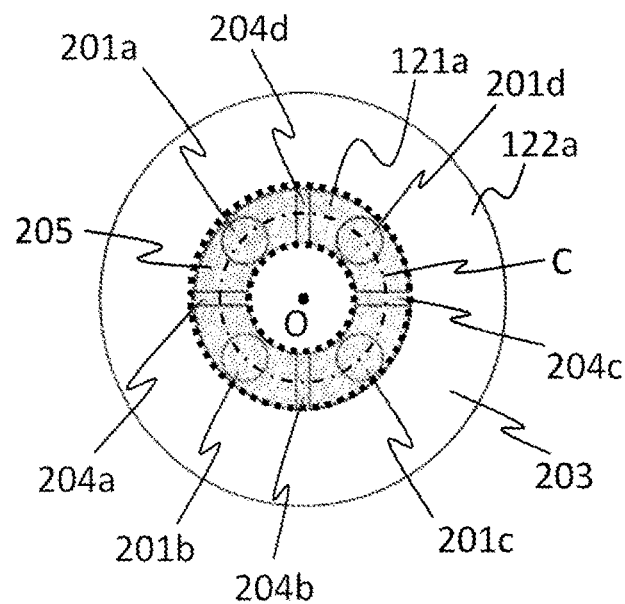

[FIG. 3]
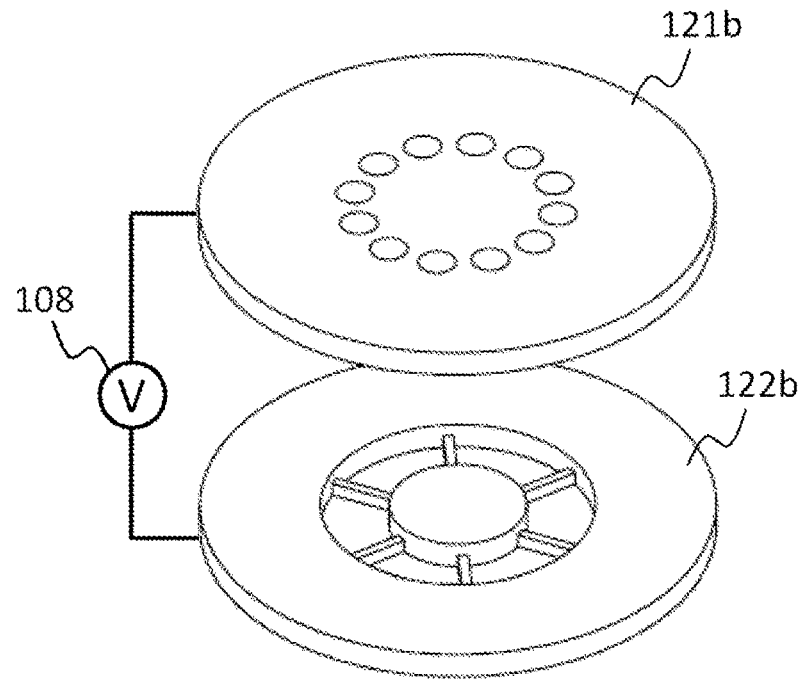
[FIG. 4]
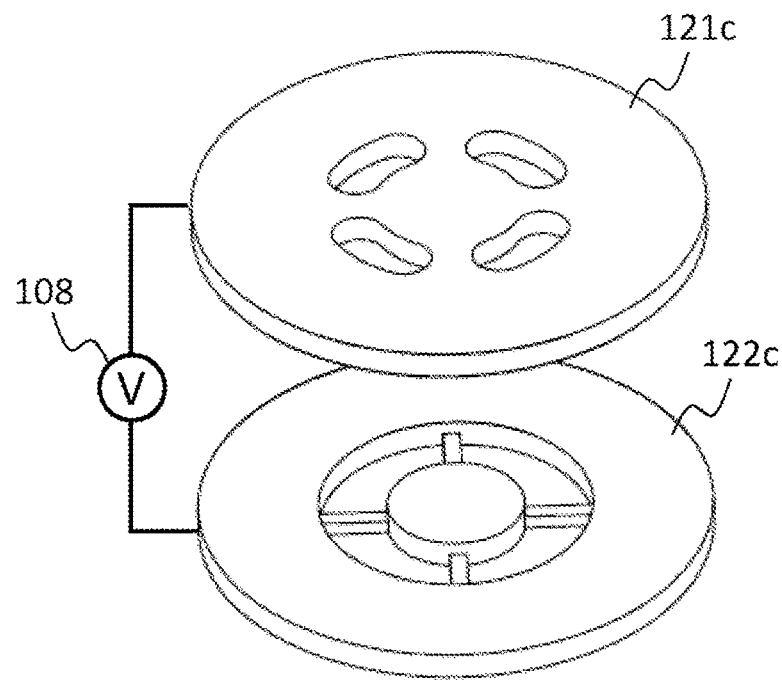

[FIG. 5A]
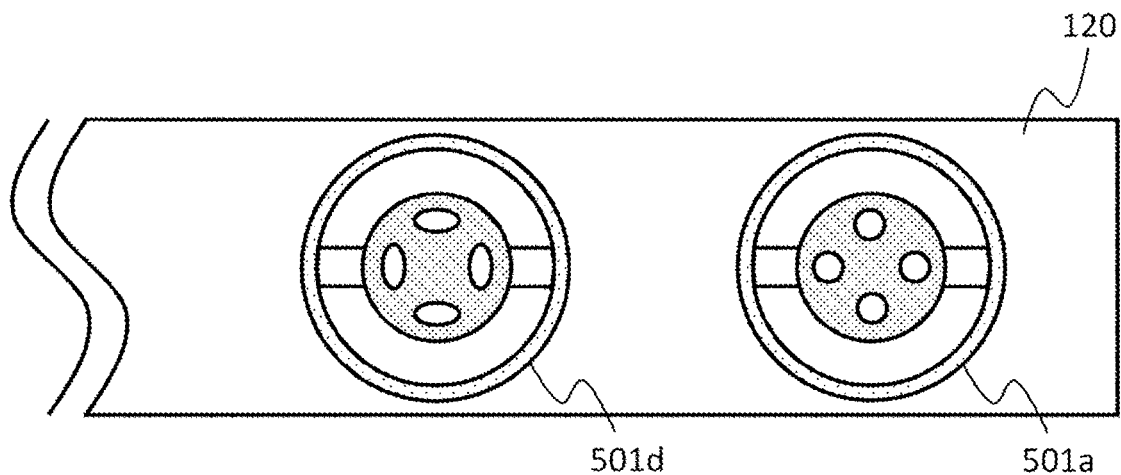
[FIG. 5B]
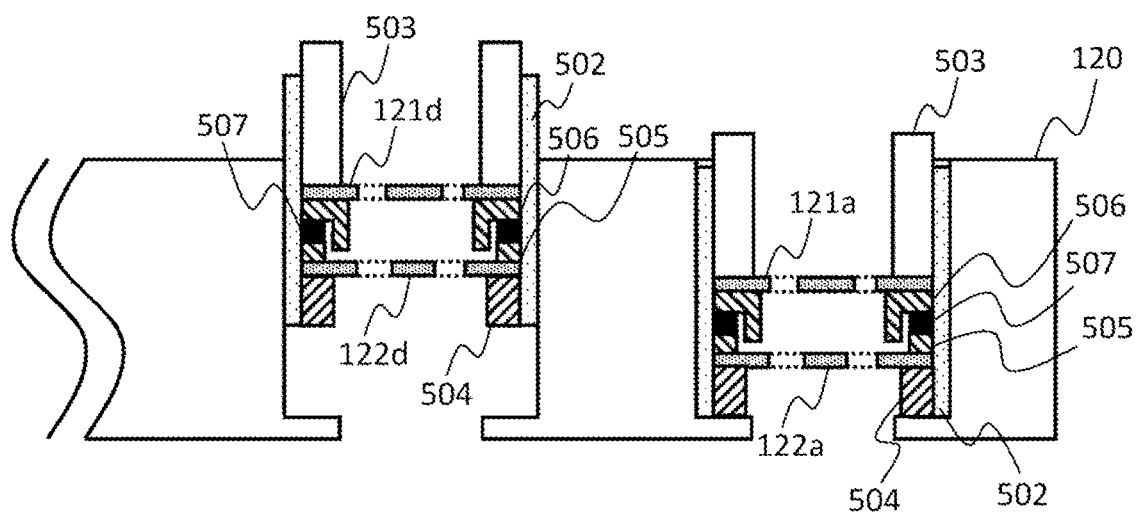

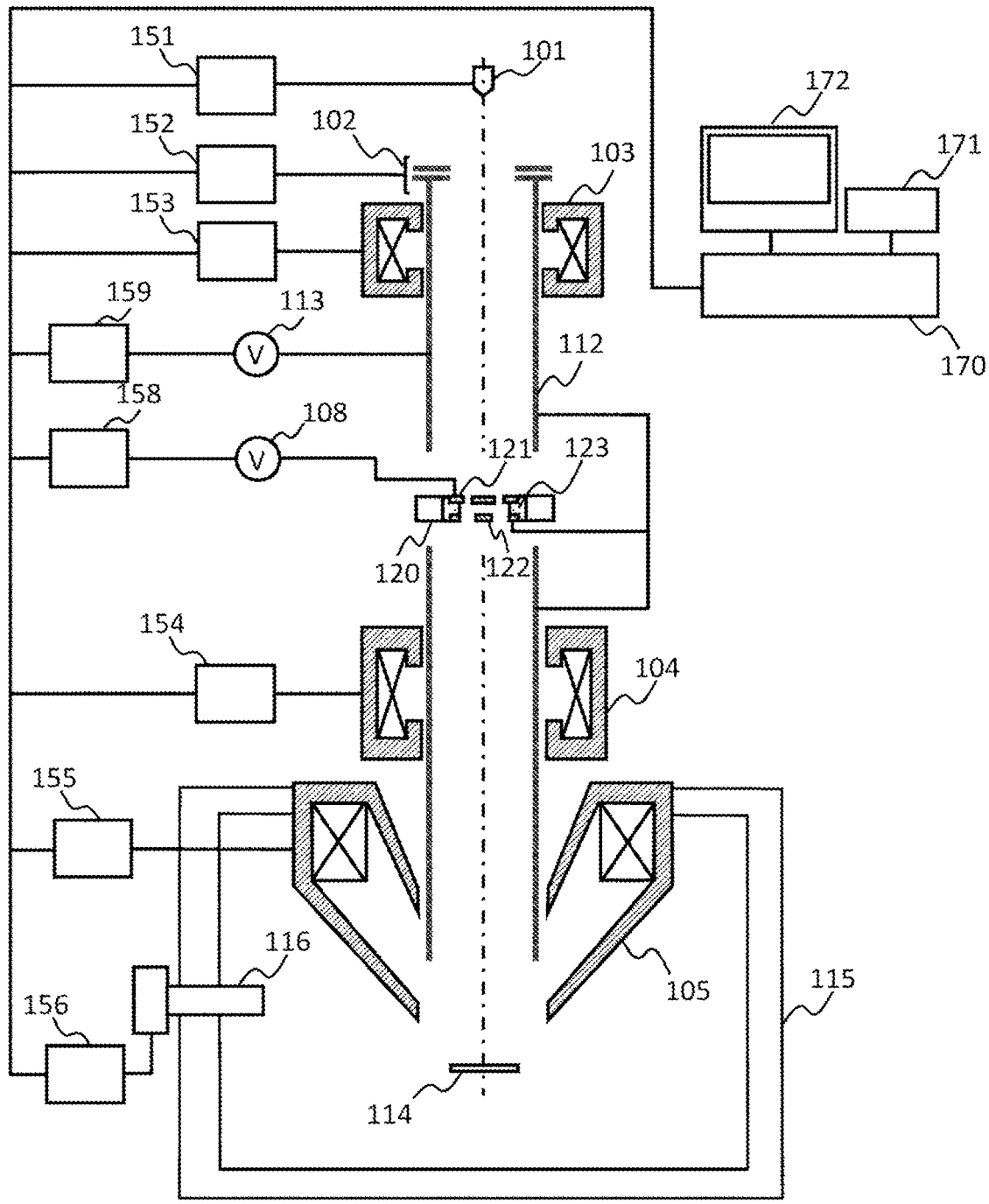
[FIG. 6]

[FIG. 7]
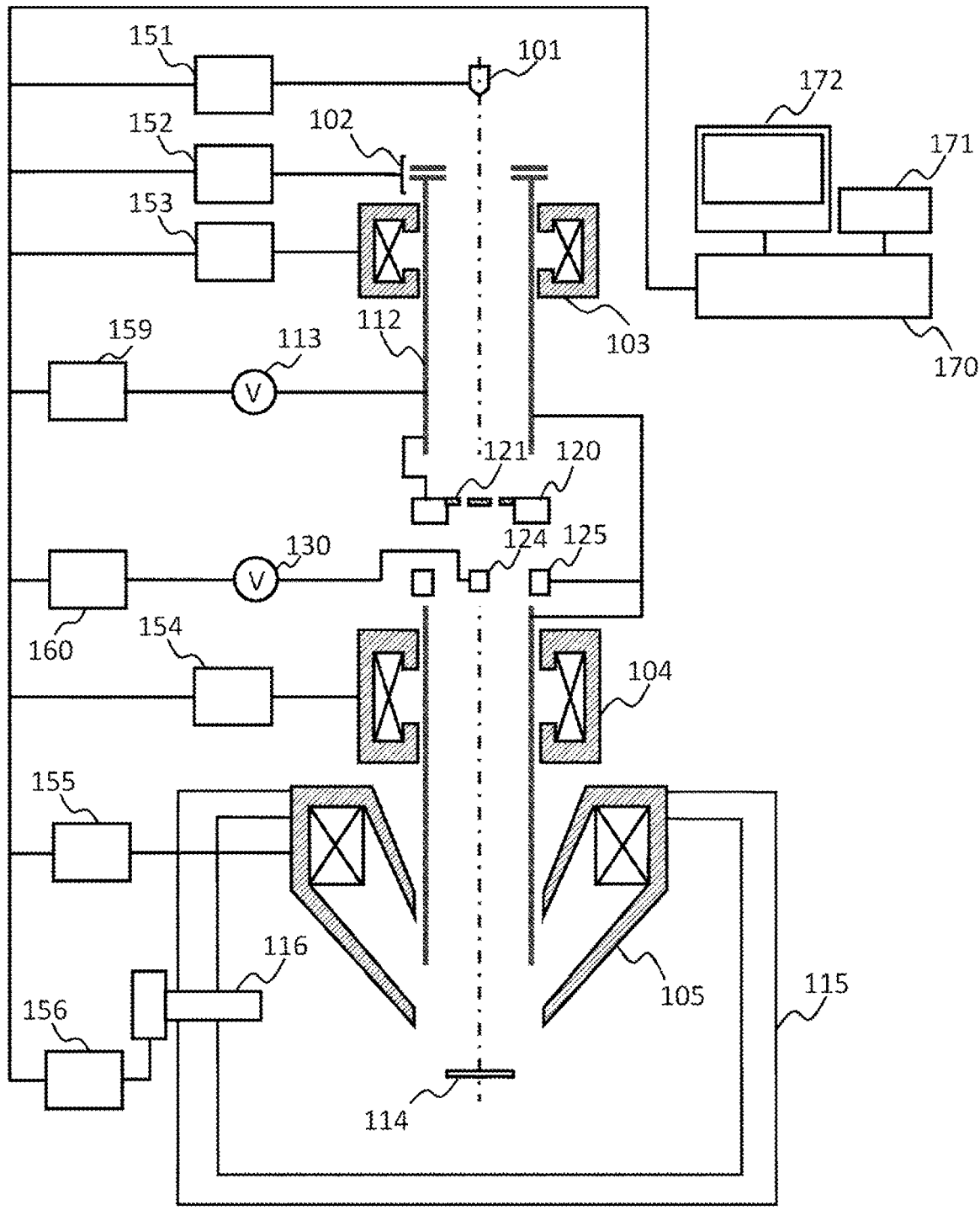

[FIG. 8]
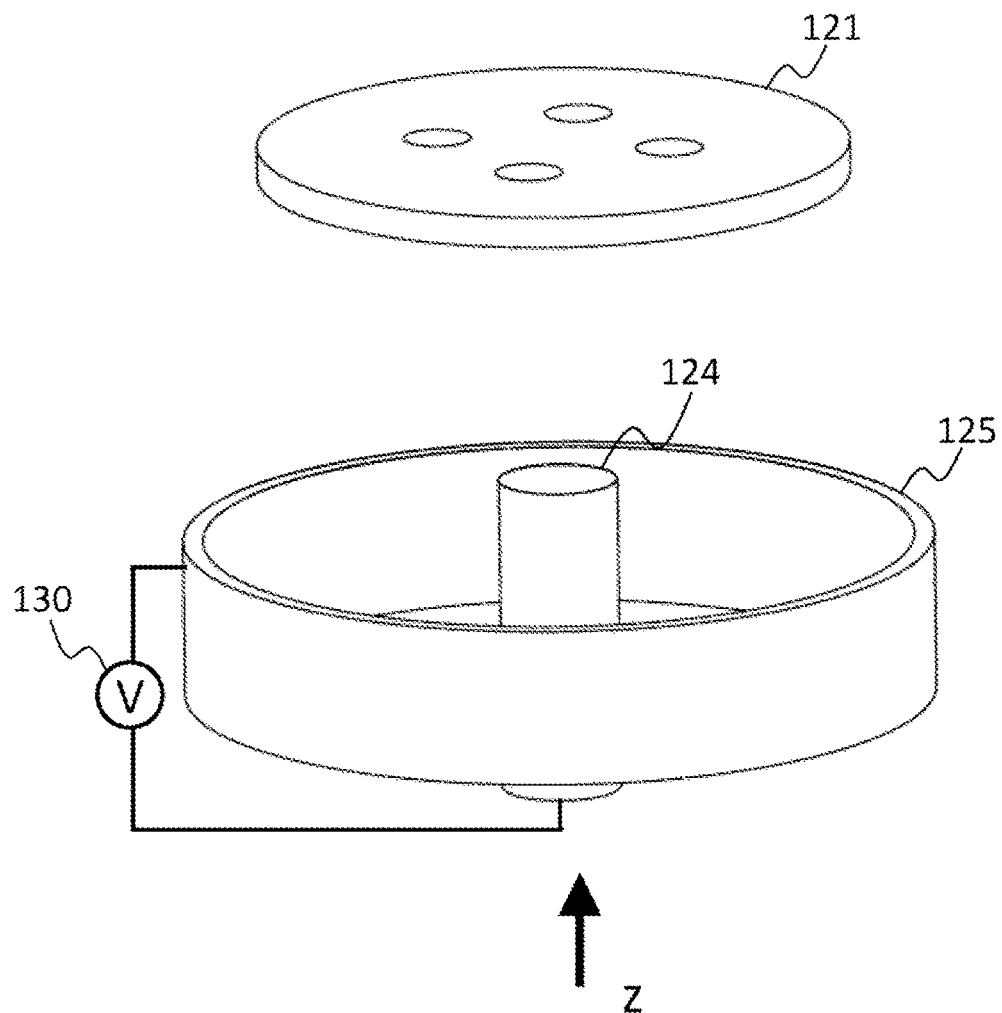

CHARGED PARTICLE BEAM APPARATUS

TECHNICAL FIELD

The present invention relates to a charged particle beam apparatus.

BACKGROUND ART

A scanning electron microscope (SEM), a scanning transmission electron microscope (STEM), or a focused ion beam apparatus (FIB) is an apparatus that can execute nano-level observation and analysis and is used as an essential tool in various fields such as a semiconductor field, a material field, or a medical field. In various fields including the semiconductor field where miniaturization is progressing, further improvement of image resolution or processing accuracy is required.

WO-A-2016/174891 (PTL 1) discloses that a spherical aberration correction effect is obtained by using an electrode of a circular aperture and an electrode of an annular aperture in combination and applying a voltage between the two electrodes. JP-A-2016-46263 (PTL 2) discloses an aberration correction apparatus including: an aberration correction unit that applies a voltage between a first conductive element and a second conductive element, the first conductive element being arranged on an axis and the second conductive element being arranged rotationally symmetrical about the first conductive element; and an annular aperture that is provided in front of or in rear of the aberration correction unit. In this aberration correction apparatus, the spherical aberration correction effect is obtained by causing an annular beam formed by the annular aperture or the aberration correction unit to propagate through the aberration correction unit.

CITATION LIST

Patent Literature

PTL 1: WO-A-2016/174891
PTL 2: JP-A-2016-46263

SUMMARY OF INVENTION

Technical Problem

Both of the electrode of the annular aperture in the aberration correction apparatus disclosed in the PTL 1 and the annular aperture or the aberration correction unit in the aberration correction apparatus disclosed in PTL 2 include an on-axis light shielding unit and an off-axis light shielding unit in order to form an annular beam. When the on-axis light shielding unit and the off-axis light shielding unit are irradiated with a charged particle beam, there is a difference in charged particle dose between the on-axis light shielding unit and the off-axis light shielding unit, and thus there is a difference in surface potential between the on-axis light shielding unit and the off-axis light shielding unit. Therefore, the charged particle beam is affected by an unintentional deflection action when transmitting through the annular aperture, and thus desired performance cannot be obtained.

Solution to Problem

According to one embodiment of the present invention, there is provided a charged particle beam apparatus including: a charged particle beam source that emits a charged particle beam; an objective lens that focuses the charged particle beam on a sample; a charged particle beam aperture stop and an electrode that are arranged on an optical axis between the charged particle beam source and the objective lens; and a power supply that applies a voltage between the charged particle beam aperture stop and the electrode, in which the voltage that is applied from the electrode to the charged particle beam aperture stop by the power supply is a voltage having a polarity opposite to a charge of the charged particle beam, the electrode includes an annular aperture, and the charged particle beam aperture stop includes a plurality of apertures that are arranged at positions overlapping the annular aperture of the electrode when viewed in a direction along the optical axis.

In addition, according to another embodiment of the present invention, there is provided a charged particle beam apparatus including: a charged particle beam source that emits a charged particle beam; an objective lens that focuses the charged particle beam on a sample; a charged particle beam aperture stop and an on-axis electrode that are arranged on an optical axis between the charged particle beam source and the objective lens; an off-axis electrode that is provided to surround the on-axis electrode; and a power supply that applies a voltage between the on-axis electrode and the off-axis electrode, in which the voltage that is applied from the on-axis electrode to the off-axis electrode by the power supply is a voltage having a polarity opposite to a charge of the charged particle beam, and the charged particle beam aperture stop includes a plurality of apertures that are arranged at positions overlapping a gap between the on-axis electrode and the off-axis electrode when viewed in a direction along the optical axis.

Advantageous Effects of Invention

A charged particle beam apparatus capable of stably obtaining a spherical aberration correction effect can be provided.

Other objects and new characteristics will be clarified with reference to description of the specification and the accompanying drawings.

BRIEF DESCRIPTION OF DRAWINGS

FIG. 1 is a schematic view illustrating a charged particle beam apparatus according to a first embodiment.

FIG. 2A is a diagram illustrating an aperture shape and an arrangement of a charged particle beam aperture stop and an electrode.

FIG. 2B is a diagram illustrating the aperture shape and the arrangement of the charged particle beam aperture stop and the electrode.

FIG. 3 is a diagram illustrating an aperture shape and an arrangement of the charged particle beam aperture stop and the electrode.

FIG. 4 is a diagram illustrating an aperture shape and an arrangement of the charged particle beam aperture stop and the electrode.

FIG. 5A is a diagram illustrating an example of an aberration correction unit and a holder.

FIG. 5B is a diagram illustrating an example of the aberration correction unit and the holder.

FIG. 6 is a schematic view illustrating a charged particle beam apparatus according to a second embodiment.

FIG. 7 is a schematic view illustrating a charged particle beam apparatus according to a third embodiment.

FIG. 8 is a schematic view illustrating a charged particle beam aperture stop, an on-axis electrode, and an off-axis electrode.

DESCRIPTION OF EMBODIMENTS

New characteristics and effects of the present invention will be described using the drawings. Embodiments are merely examples for implementing the present invention and do not limit the technical scope of the present invention. In addition, common configurations in the respective drawings are represented by the same reference numerals.

First Embodiment

FIG. 1 illustrates the outline of a charged particle beam apparatus according to a first embodiment. The charged particle beam apparatus includes, as main components: a charged particle beam source 101 that forms a charged particle beam; an acceleration electrode 102 that accelerates the charged particle beam emitted from the charged particle beam source 101; first and second condenser lenses 103 and 104 that condense the charged particle beam emitted from the charged particle beam source 101; an objective lens 105 that focuses the charged particle beam on a sample; a sample chamber 115 where a sample 114 is arranged; and a detector 116 that detects secondary charged particles emitted from the sample.

In addition, on an optical axis between the first condenser lens 103 and the second condenser lens 104, a plurality of apertures are arranged on a circumference, and a charged particle beam aperture stop 121 that shields a part of the charged particles emitted from the charged particle beam source 101 and an electrode 122 having an annular shape are arranged. The charged particle beam aperture stop 121 and the electrode 122 are held by a holder 120 in a state of being electrically insulated from each other by an insulating material 123. A power supply 108 can apply a predetermined voltage between the charged particle beam aperture stop 121 and the electrode 122.

As controllers that control the respective components of the charged particle optical systems, the charged particle beam apparatus includes: a charged particle beam source controller 151 that controls the charged particle beam source 101; an acceleration electrode controller 152 that controls the acceleration electrode 102; first and second condenser lens controllers 153 and 154 that control the first and second condenser lenses 103 and 104; an objective lens controller 155 that controls the objective lens 105; a power supply controller 158 that controls the power supply 108; and a detector controller 156 that controls the detector 116. The controllers are controlled by an integrated computer 170 that controls an overall operation of the charged particle beam apparatus and constructs a charged particle beam image. The integrated computer 170 is connected to a controller (for example, a keyboard or a mouse) 171 and a display 172, and an operator can input various instructions such as irradiation conditions, voltage conditions of the charged particle beam aperture stop, or position conditions from the controller 171 and can cause the display 172 to display an acquired image or a control screen. The components of the charged particle beam apparatus illustrated in FIG. 1 are a part of the charged particle beam apparatus, and it is needless to say that the charged particle beam apparatus includes a component that is essential for the charged particle beam apparatus, for example, a deflection system for scanning and shifting a charged particle beam.

In addition, in the example shown in FIG. 1, the two condenser lenses 103 and 104 are provided. However, the number of condenser lenses for controlling the charged particles incident on the objective lens 105 is not limited. The objective lens 105 includes a lens of a type that prevents a magnetic field from leaking to the outside of a magnetic path. However, the objective lens 105 may be a lens of a type that allows a magnetic field to leak to the outside of a magnetic path or may be a compound objective lens including both of a lens of the type that allows a magnetic field to leak and a lens of the type that prevents a magnetic field from leaking. In addition, each of the condenser lenses 103 and 104 and the objective lens 105 may be an electrostatic lens or an objective lens where a magnetic lens and an electrostatic lens are combined as in a booster optical system or a retarding optical system for the above-described purposes, or may be a lens of any type for the purpose of focusing the charged particle beam on the sample 114. In addition, the detector that detects the secondary charged particles may be arranged in the sample chamber 115, or may be arranged in a column containing the charged particle optical systems. For the purpose of detecting the secondary charged particles, the number and the arrangement locations of the detectors are not limited. A plurality of charged particle beam columns may be provided.

In the first embodiment, the voltage that is applied between the charged particle beam aperture stop 121 and the electrode 122 is a voltage that undergoes the divergence action when the charged particle beam transmits through the aperture of the electrode 122 having an annular shape. That is, when the charged particle beam is an electron beam having negative charge, the electrode 122 applies a positive voltage to the charged particle beam aperture stop 121. On the other hand, when the charged particle beam is an electron beam having positive charge, the electrode 122 applies a negative voltage to the charged particle beam aperture stop 121. As long as the above-described conditions are satisfied, a method of applying the voltage between the charged particle beam aperture stop 121 and the electrode 122 is not limited. As illustrated in FIG. 1, the power supply 108 may be connected to the charged particle beam aperture stop 121 such that the electrode 122 functions as a reference potential (GND), the power supply 108 may be connected to the electrode 122 such that the charged particle beam aperture stop 121 functions as a reference potential (GND), or the power supply may be connected to both the charged particle beam aperture stop 121 and the electrode 122.

Next, an example of an aperture shape and an arrangement of the charged particle beam aperture stop 121 and the electrode 122 will be shown. FIG. 2A is a perspective view, and FIG. 2B is a plan view in a direction Z along the optical axis of FIG. 2A. In a charged particle beam aperture stop 121a, a plurality of circular apertures 201a to 201d are arranged on a circumference. An electrode 122a includes: an on-axis electrode portion 202; a ring-shaped off-axis electrode portion 203; and beams 204a to 204d that hold the on-axis electrode portion 202 using the off-axis electrode portion 203. The power supply 108 applies a predetermined voltage between the charged particle beam aperture stop 121a and the electrode 122a. In addition, as illustrated in FIG. 2B, the plurality of circular apertures 201a to 201d of the charged particle beam aperture stop 121a are arranged at positions overlapping an annular aperture 205 that is formed by the on-axis electrode portion 202 and the off-axis electrode portion of the electrode 122a.

As a result, the influence of a difference in surface potential between the on-axis electrode portion 202 and the off-axis electrode portion 203 that is caused when the electrode 122a is directly irradiated with the charged particle beam as in the related art can be reduced. In addition, the annular aperture of the electrode 122a is irradiated with the charged particle beams transmitted through the circular apertures 201 of the charged particle beam aperture stop 121a, and the charged particle doses of the charged particle beams transmitted through the circular apertures 201 are substantially the same. As a result, a stable spherical aberration correction effect can be obtained. When the charged particle beam aperture stop 121a is directly irradiated with the charged particle beam, there may be a difference in surface potential around the circular aperture, and a conductor portion that configures the aperture stop for the aperture is widened. Therefore, as compared to the electrode 122a where the on-axis electrode portion 202 and the off-axis electrode portion 203 are connected through only the beams 204, a difference in surface potential in the charged particle beam aperture stop 121a can be easily alleviated, and there is no deflection action on the charged particle beam to be transmitted.

In this case, the aperture of the charged particle beam aperture stop 121a needs to be provided to prevent the occurrence of anisotropy in the charged particle beam when the charged particle beam transmitted through the charged particle beam aperture stop 121 and the electrode 122 is focused on one point by an electron lens.

In the example illustrated in FIGS. 2A and 2B, the plurality of circular apertures 201a to 201d are arranged such that the centers thereof are on a circumference C and they are line-symmetric to two axes perpendicular to each other. Here, a center O of the circumference C is arranged to overlap the center of the annular aperture 205 of the electrode 122 when viewed in the direction Z along the optical axis, and the center O of the circumference C and the center of the annular aperture 205 are arranged on the optical axis in the charged particle beam apparatus.

The size of the circumference C is a size overlapping at least the annular aperture 205. In addition, the plurality of circular apertures 201a to 201d have the same size, and the diameter of the circular apertures 201 is less than or equal to the width of the annular aperture 205 (difference between the radius of the aperture portion of the off-axis electrode portion 203 and the radius of the on-axis electrode portion 202). Further, when the charged particle beam aperture stop 121 and the electrode 122 are laminated, they are laminated such that the circular apertures 201a to 201d and the beams 204a to 204d do not overlap each other.

In the embodiment, the shape and the arrangement are not limited to those shown in FIGS. 2A and 2B, and various modification examples can be adopted as long as the influence of the difference in surface potential between the on-axis electrode portion 202 and the off-axis electrode portion 203 can be reduced and the anisotropy of the charged particle beam caused by the charged particle beam aperture stop 121 can be reduced to be in an allowable range.

For example, as the number of circular apertures provided in the charged particle beam aperture stop 121 increases, the anisotropy is not likely to occur in the charged particle beam that is focused on the sample. FIG. 3 illustrates an example where 12 circular apertures are arranged on the circumference. When the circular apertures are provided in the charged particle beam aperture stop 121, the circular apertures are arranged such that all of a 2k number (where k represents an integer) of circular apertures have the same size and an angle between lines connecting the center of the charged particle beam aperture stop 121 and centers of the circular apertures adjacent to each other is $(180/k)°$. FIG. 3 corresponds to a case where k=6.

Further, the aperture shape provided in the charged particle beam aperture stop 121 is not limited to a circular shape. The aperture shape may be an oval shape, an elliptical shape, or a curved oval shape illustrated in FIG. 4. A 2k number (where k represents an integer) of circular apertures may be arranged such that the aperture shape is a shape that is line-symmetric to the diameter of the charged particle beam aperture stop 121, all the circular apertures have the same size, and an angle between symmetry axes of the apertures adjacent to each other is $(180/k)°$. When the aperture shape is not circular, the centroids of the apertures are placed on the circumference C. FIG. 4 corresponds to a case where k=2.

In the example of the charged particle beam apparatus illustrated in FIG. 1, one set including the charged particle beam aperture stop 121 and the electrode 122 is mounted on the holder 120. Plural sets including the charged particle beam aperture stops 121 and the electrodes 122 may be mounted on the holder 120 to be switched therebetween. FIG. 5A illustrates an example of the holder 120 that supports an aberration correction unit 501a and an aberration correction unit 501b. The aberration correction units 501 includes a combination of the charged particle beam aperture stop 121 and the electrode 122, and are attachable and detachable to and from the holder 120 on a basis of the unit. By replacing the aberration correction units 501 on a basis of the unit, when the aberration correction unit that is contaminated is replaced or when different aberration correction units are mounted, the replacement of the aberration correction unit corresponding to a desire of a user can be easily performed. For example, in the example of FIG. 5A, the aperture shape of the charged particle beam aperture stop varies between the two aberration correction units 501.

The structure of the aberration correction units 501 will be described using FIG. 5B. The holder 120 is a conductor, and a voltage is applied between the charged particle beam aperture stop 121a and the electrode 122a. Therefore, the holder 120 and the charged particle beam aperture stop 121a are electrically insulated from each other by an insulating unit case 502 having a cylindrical shape, and the charged particle beam aperture stop 121a and the electrode 122a are electrically insulated from each other by an insulating ring 507. Here, it is desirable that the insulating material such as the unit case 502 and the insulating ring 507 are invisible from a path of the charged particle beam. Thus, as in the cross-sectional view of FIG. 5B, in the unit case 502, a lower spacer 504, the electrode 122, an intermediate spacer 505, the insulating ring 507, an upper spacer 506, and the charged particle beam aperture stop 121 are accommodated in order from below (the sample side), and are fixed to an opening portion of the holder 120 by a pressing screw 503. All of the lower spacer 504, the intermediate spacer 505, and the upper spacer 506 are conductors. This way, the upper spacer 506 having a small inner diameter and the intermediate spacer 505 having a large inner diameter are arranged between the charged particle beam aperture stop 121 and the electrode 122 through the insulating ring 507, and the insulating ring 507 is invisible from the optical axis by an inner wall of the upper spacer 506.

Second Embodiment

FIG. 6 illustrates the outline of a charged particle beam apparatus according to a second embodiment. The charged particle beam apparatus according to the second embodiment is different from that of the first embodiment in that the charged particle beam apparatus includes: a beam tube 112 that is arranged in a range from the acceleration electrode 102 to the vicinity of a lower end of the objective lens 105; a beam tube power supply 113 that applies a voltage to the beam tube; and a beam tube power supply controller 159 that controls the beam tube power supply 113. The other apparatus configurations are the same as the apparatus configurations of the first embodiment. In the configuration of FIG. 6, the electrode 122 is electrically connected to the beam tube 112, and a voltage is applied from the power supply 108 to the charged particle beam aperture stop 121. However, a configuration in which the charged particle beam aperture stop 121 is electrically connected to the beam tube and a voltage is applied from the power supply 108 to the electrode 122 may be adopted, or a configuration in which voltages different from that of the beam tube 112 are applied to both of the charged particle beam aperture stop 121 and the electrode 122 may be adopted.

In addition, in the example of FIG. 6, the single beam tube power supply 113 and the single beam tube power supply controller 159 are provided. When the beam tube is divided halfway or is electrically insulated, a plurality of beam tube power supplies and a plurality of beam tube power supply controllers corresponding to the divided beam tube can be provided.

Third Embodiment

FIG. 7 illustrates the outline of a charged particle beam apparatus according to a third embodiment. The charged particle beam apparatus according to the third embodiment is different from that of the second embodiment in that, instead of the electrode 122, the charged particle beam apparatus includes: an on-axis electrode 124; an off-axis electrode 125; an on-axis electrode power supply 130 that applies a voltage to the on-axis electrode 124; and an on-axis electrode power supply controller 160 that controls the on-axis electrode power supply 130. The other apparatus configurations are the same as the apparatus configurations of the second embodiment. In the configuration of FIG. 7, the charged particle beam aperture stop 121 and the off-axis electrode 125 are electrically connected to the beam tube 112, and a voltage is applied from the on-axis electrode power supply 130 to the on-axis electrode 124. However, a configuration in which a voltage different from that of the beam tube 112 is applicable to each of the charged particle beam aperture stop 121, the on-axis electrode 124, and the off-axis electrode 125 may be adopted.

FIG. 8 is a schematic view illustrating the charged particle beam aperture stop 121, the on-axis electrode 124, and the off-axis electrode 125. The cylindrical off-axis electrode 125 is arranged to surround the columnar on-axis electrode 124, and the on-axis electrode 124 and the off-axis electrode 125 are arranged on the sample side further than the charged particle beam aperture stop 121. In the example of FIG. 8, the shape of the on-axis electrode is columnar. However, as long as an electric field generated from the electrode is directed in a direction perpendicular to the optical axis of the charged particle beam, the shape of the on-axis electrode is not limited. The aperture shape and the arrangement in the charged particle beam aperture stop 121 and the arrangement of the charged particle beam aperture stop 121, the on-axis electrode 124, and the off-axis electrode 125 are the same as those of the first embodiment. The annular aperture 205 of the electrode 122 in the first embodiment may be replaced with a gap between the on-axis electrode 124 and the off-axis electrode 125. In addition, the center of the circumference where the centroids of the plurality of apertures of the charged particle beam aperture stop 121 are arranged is arranged to overlap a central axis of the on-axis electrode 124 when viewed in the direction Z along the optical axis.

The voltage that is applied to the on-axis electrode 124 is a voltage that undergoes the divergence action outside the axis when the charged particle beam transmits through the vicinity of the on-axis electrode 124. That is, when the charged particle beam is an electron beam having negative charge, a positive voltage is applied to the off-axis electrode 125. On the other hand, when the charged particle beam is an electron beam having positive charge, a negative voltage is applied to the off-axis electrode 125.

REFERENCE SIGNS LIST

101: charged particle beam source
102: acceleration electrode
103: first condenser lens
104: second condenser lens
105: objective lens
108: power supply
112: beam tube
113: beam tube power supply
114: sample
115: sample chamber
116: detector
120: holder
121: charged particle beam aperture stop
122: electrode
123: insulating material
124: on-axis electrode
125: off-axis electrode
130: on-axis electrode power supply
151: charged particle beam source controller
152: acceleration electrode controller
153: first condenser lens controller
154: second condenser lens controller
155: objective lens controller
156: detector controller
158: power supply controller
159: beam tube power supply controller
160: on-axis electrode power supply controller
170: integrated computer
171: controller
172: display
201: circular aperture
202: on-axis electrode portion
203: off-axis electrode portion
204: beam
205: annular aperture
501: aberration correction unit
502: unit case
503: pressing screw
504: lower spacer
505: intermediate spacer
506: upper spacer
507: insulating ring

The invention claimed is:
1. A charged particle beam apparatus comprising:
a charged particle beam source that emits a charged particle beam;
an objective lens that focuses the charged particle beam on a sample;

a charged particle beam aperture stop and an electrode that are arranged on an optical axis between the charged particle beam source and the objective lens; and a power supply that applies a voltage between the charged particle beam aperture stop and the electrode, wherein the voltage that is applied from the electrode to the charged particle beam aperture stop by the power supply is a voltage having a polarity opposite to a polarity of the charged particle beam, the electrode includes an annular aperture, and the charged particle beam aperture stop includes a plurality of apertures that are arranged at positions overlapping the annular aperture of the electrode when viewed in a direction along the optical axis.

2. The charged particle beam apparatus according to claim 1, wherein the electrode includes an on-axis electrode portion that is positioned on the optical axis, a ring-shaped off-axis electrode portion, and a plurality of beams that hold the on-axis electrode portion using the off-axis electrode portion.

3. The charged particle beam apparatus according to claim 2, wherein centroids of the plurality of apertures of the charged particle beam aperture stop are arranged on a circumference, a center of the circumference overlaps a center of the annular aperture of the electrode when viewed in the direction from the optical axis, and the circumference has a size that overlaps the annular aperture of the electrode.

4. The charged particle beam apparatus according to claim 3, wherein the plurality of apertures are circular apertures having the same size.

5. The charged particle beam apparatus according to claim 4, wherein a diameter of the circular aperture is less than or equal to a width of the annular aperture.

6. The charged particle beam apparatus according to claim 4, wherein the charged particle beam aperture stop is provided with a 2k number (k represents an integer) of the circular apertures, and an angle between lines connecting the center of the circumference and centers of the circular apertures adjacent to each other is (180/k)°.

7. The charged particle beam apparatus according to claim 3, wherein the plurality of apertures have the same size and have a shape that is line-symmetric to a diameter of the circumference.

8. The charged particle beam apparatus according to claim 7, wherein the charged particle beam aperture stop is provided with a 2k number (k represents an integer) of the apertures, and an angle between symmetry axes of the apertures adjacent to each other is (180/k)°.

9. The charged particle beam apparatus according to claim 2, wherein the plurality of apertures of the charged particle beam aperture stop are arranged at positions not overlapping the plurality of beams of the electrode when viewed in the direction along the optical axis.

10. The charged particle beam apparatus according to claim 1, further comprising a holder that holds the charged particle beam aperture stop and the electrode, wherein the charged particle beam aperture stop and the electrode are held by the holder through an insulating material that electrically insulates the charged particle beam aperture stop and the electrode from each other.

11. The charged particle beam apparatus according to claim 10, wherein the holder holds one or more aberration correction units including a combination of the charged particle beam aperture stop and the electrode.

12. The charged particle beam apparatus according to claim 11, wherein the aberration correction units are attachable and detachable to and from the holder on a basis of the aberration correction unit.

13. A charged particle beam apparatus comprising:

a charged particle beam source that emits a charged particle beam;

an objective lens that focuses the charged particle beam on a sample;

a charged particle beam aperture stop and an on-axis electrode that are arranged on an optical axis between the charged particle beam source and the objective lens;

an off-axis electrode that is provided to surround the on-axis electrode; and a power supply that applies a voltage between the on-axis electrode and the off-axis electrode, wherein the voltage that is applied from the on-axis electrode to the off-axis electrode by the power supply is a voltage having a polarity opposite to a polarity of the charged particle beam, and the charged particle beam aperture stop includes a plurality of apertures that are arranged at positions overlapping a gap between the on-axis electrode and the off-axis electrode when viewed in a direction along the optical axis.

14. The charged particle beam apparatus according to claim 13, wherein the on-axis electrode is columnar, and the off-axis electrode is cylindrical.

15. The charged particle beam apparatus according to claim 13, wherein centroids of the plurality of apertures of the charged particle beam aperture stop are arranged on a circumference, a center of the circumference overlaps a central axis of the on-axis electrode when viewed in the direction from the optical axis, and the circumference has a size overlapping the gap between the on-axis electrode and the off-axis electrode.

* * * * *